(12) United States Patent
Sun

(10) Patent No.: US 9,215,824 B2
(45) Date of Patent: Dec. 15, 2015

(54) SERVER AND INDICATING TAG OF THE SAME

(71) Applicant: ShenZhen Treasure City Technology Co., LTD., ShenZhen (CN)

(72) Inventor: Zheng-Heng Sun, New Taipei (TW)

(73) Assignee: ShenZhen Treasure City Technology Co., LTD., ShenZhen (CN)

( * ) Notice: Subject to any disclaimer, the term of this patent is extended or adjusted under 35 U.S.C. 154(b) by 0 days.

(21) Appl. No.: 14/332,524

(22) Filed: Jul. 16, 2014

(65) Prior Publication Data

US 2015/0022959 A1 Jan. 22, 2015

(30) Foreign Application Priority Data

Jul. 17, 2013 (CN) .......................... 2013 1 02991004

(51) Int. Cl.
*H05K 7/00* (2006.01)
*H05K 7/14* (2006.01)

(52) U.S. Cl.
CPC ................ *H05K 7/00* (2013.01); *H05K 7/1498* (2013.01)

(58) Field of Classification Search
CPC ................... G06F 1/181–1/184; G06F 1/187; G06F 1/1418; H05K 7/1498; H05K 1/14; H05K 7/00
USPC ................ 361/679.01, 47, 48, 809, 724–728, 361/728–730, 752, 796, 800, 807, 810, 361/818; 312/223.1, 223.2
See application file for complete search history.

(56) References Cited

U.S. PATENT DOCUMENTS

| | | | |
|---|---|---|---|
| 6,877,264 B2 * | 4/2005 | Mautz | 40/663 |
| 7,259,683 B2 * | 8/2007 | Abe | 340/635 |
| 7,583,507 B2 * | 9/2009 | Starr et al. | 361/727 |
| 8,625,288 B1 * | 1/2014 | Liu et al. | 361/727 |
| 2006/0061955 A1 * | 3/2006 | Imblum | 361/685 |
| 2009/0109609 A1 * | 4/2009 | Lai et al. | 361/679.39 |
| 2010/0223827 A1 * | 9/2010 | Hail et al. | 40/661.01 |
| 2014/0009893 A1 * | 1/2014 | Lai | 361/728 |

* cited by examiner

*Primary Examiner* — Hoa C Nguyen
*Assistant Examiner* — Sagar Shrestha
(74) *Attorney, Agent, or Firm* — Novak Druce Connolly Bove + Quigg LLP

(57) ABSTRACT

A server includes a main body and a plurality of indicating tags. The main body includes a plurality of electronic elements. A separating plate is located between each two adjacent electronic elements. The main body defines a plurality of engaging holes corresponding to the electronic elements. A gap is defined between the separating plate and the main body. The indicating tag includes a label plate and a mounting plate. One end of the mounting plate defines a through hole. The other end of the mounting plate forms an engaging portion. The engaging portion engages in the gap. The indicating tags can be fixed to the main body with screws extending through the through holes to engage in the engaging holes.

3 Claims, 5 Drawing Sheets

SERVER AND INDICATING TAG OF THE SAME

FIELD

The subject matter herein generally relates to a server and an indicating tag of the same.

BACKGROUND

In usually, a server cabinet comprises a number of servers. For easily distinguishing the different servers, the servers are equipped with a number of different indicating tags.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

Figure 1:
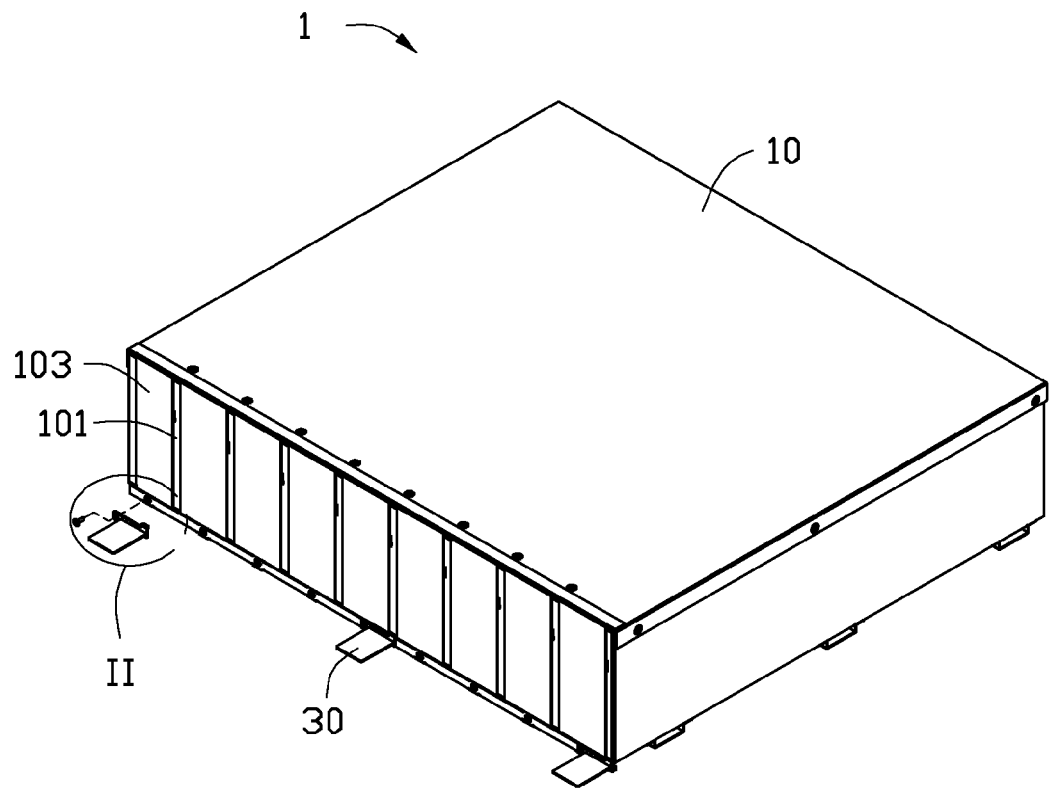
FIG. 1 is a partially exploded, isometric view of an embodiment of a server, together with a plurality of indicating tags.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

Figure 2:
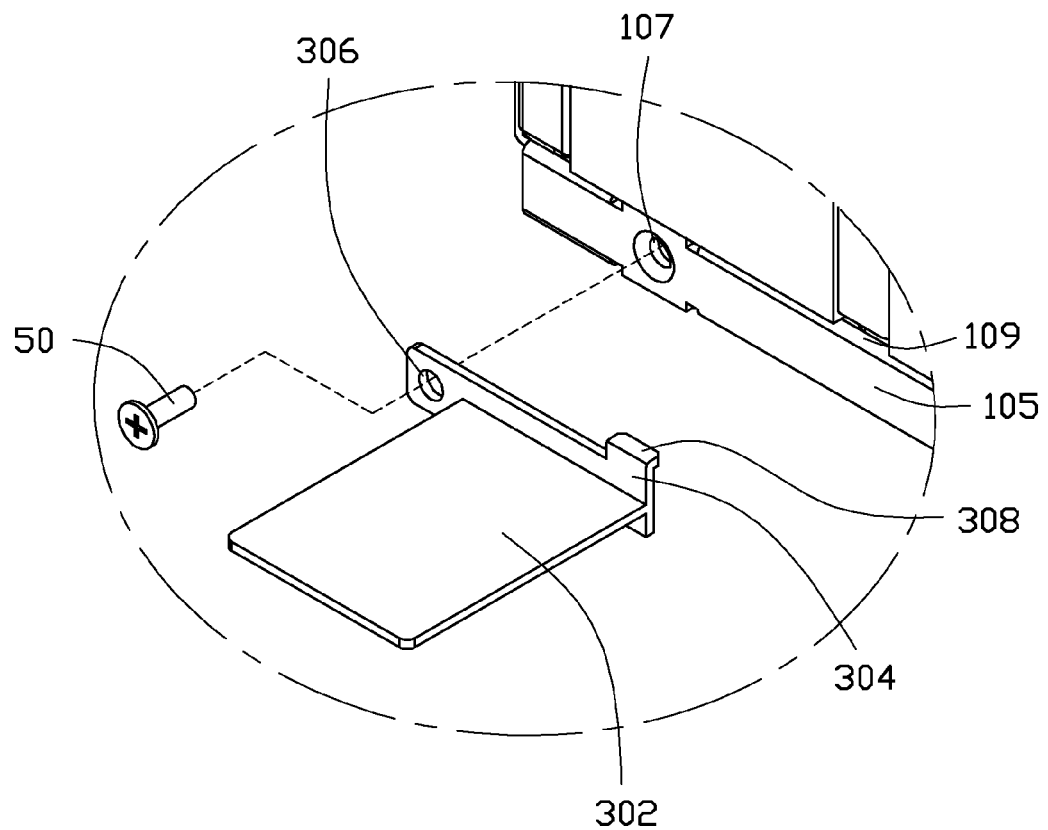
FIG. 2 is an enlarged view of the circled portion II of FIG. 1.

The present disclosure is described in relation to a server 1. FIGS. 1 and 2 illustrate that the server 1 comprises a main body 10, a plurality of indicating tags 30 and a plurality of fasteners 50. The main body 10 comprises a plurality of electronic elements 103, a separating plate 101 located between adjacent electronic elements 103, and a plurality of engaging holes 107 defined in middle portion of a lower edge 105. Each engaging hole 107 is located under each electronic element 103. A gap 109 is defined between a lower end of the separating plate 101 and the upper end of a lower edge 105. The fasteners 50 can be screws.

The indicating tag 30 comprises a label plate 302 and a mounting plate 304 substantially perpendicularly coupled to the label plate 302. The mounting plate 304 defines a through hole 306 at one end extending out from the label plate 302. The through hole 306 corresponds to the engaging hole 107. An engaging portion 308 extends up and out from a top edge of the other end of the mounting plate 304.

Figure 3:
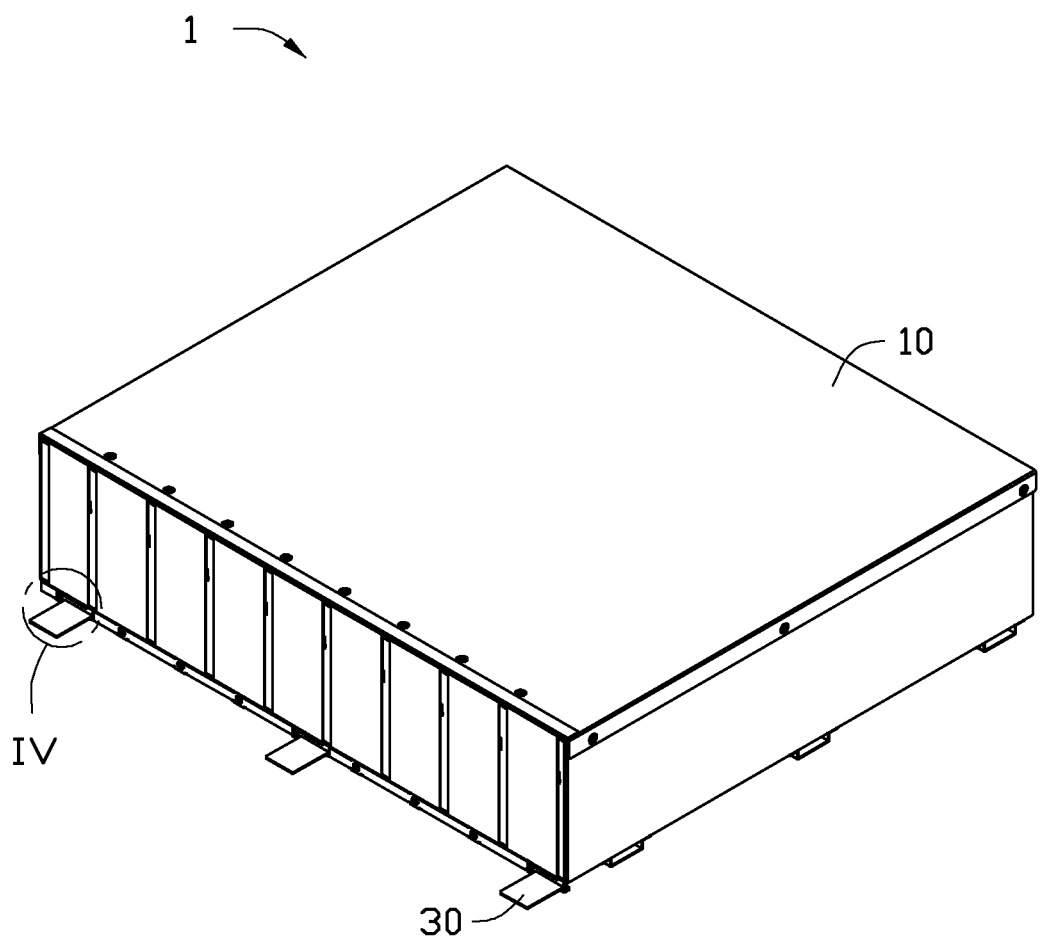
FIG. 3 is an assembled, isometric view of the server of FIG. 1.
Figure 4:
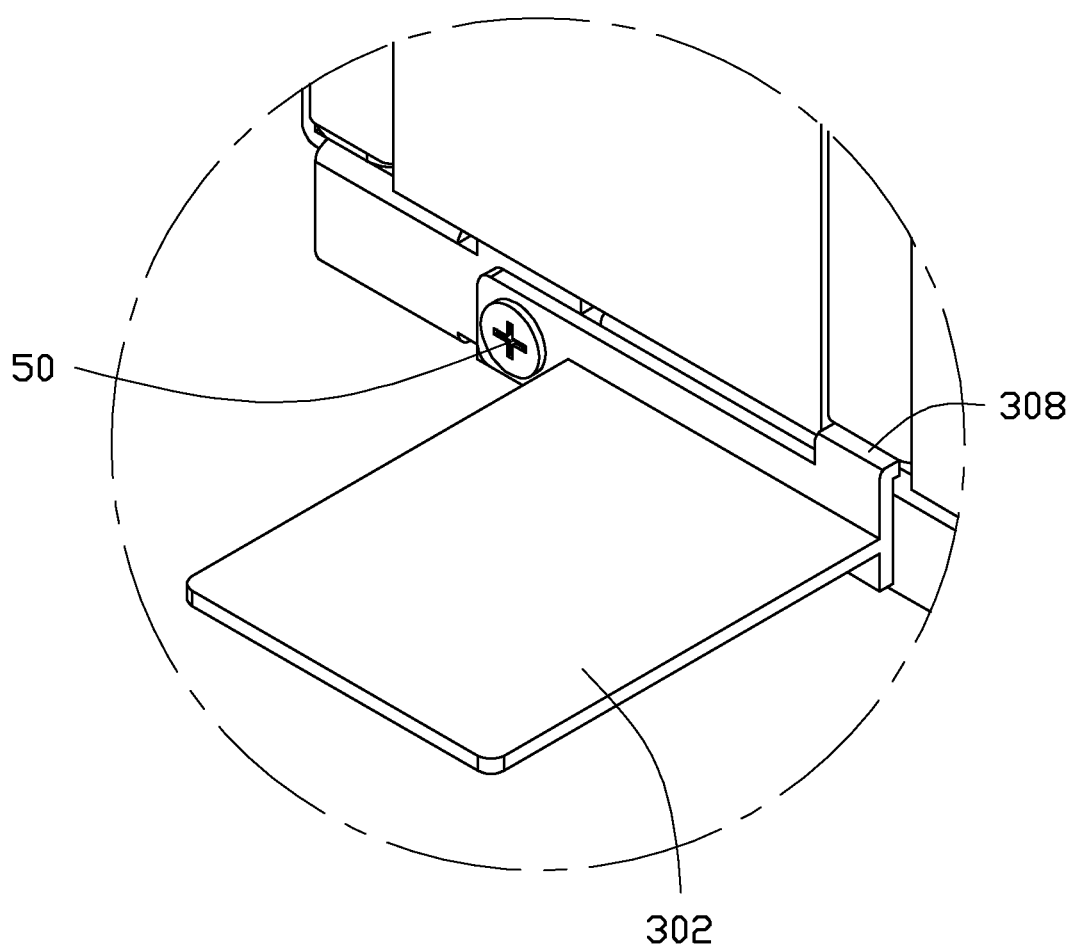
FIG. 4 is an enlarged view of the circled portion IV of FIG. 3.

Referring to FIGS. 3 and 4, in assembly, the engaging portion 308 of the indicating tag 30 is inserted into the gap 109 of the main body 10, and the through hole 306 is aligned to the engaging hole 107 of the lower edge 105. The fasteners 50 extend through the through hole 306 to engage the engaging hole 107, such that the indicating tag 30 is fixed to the main body 10.

Figure 5:
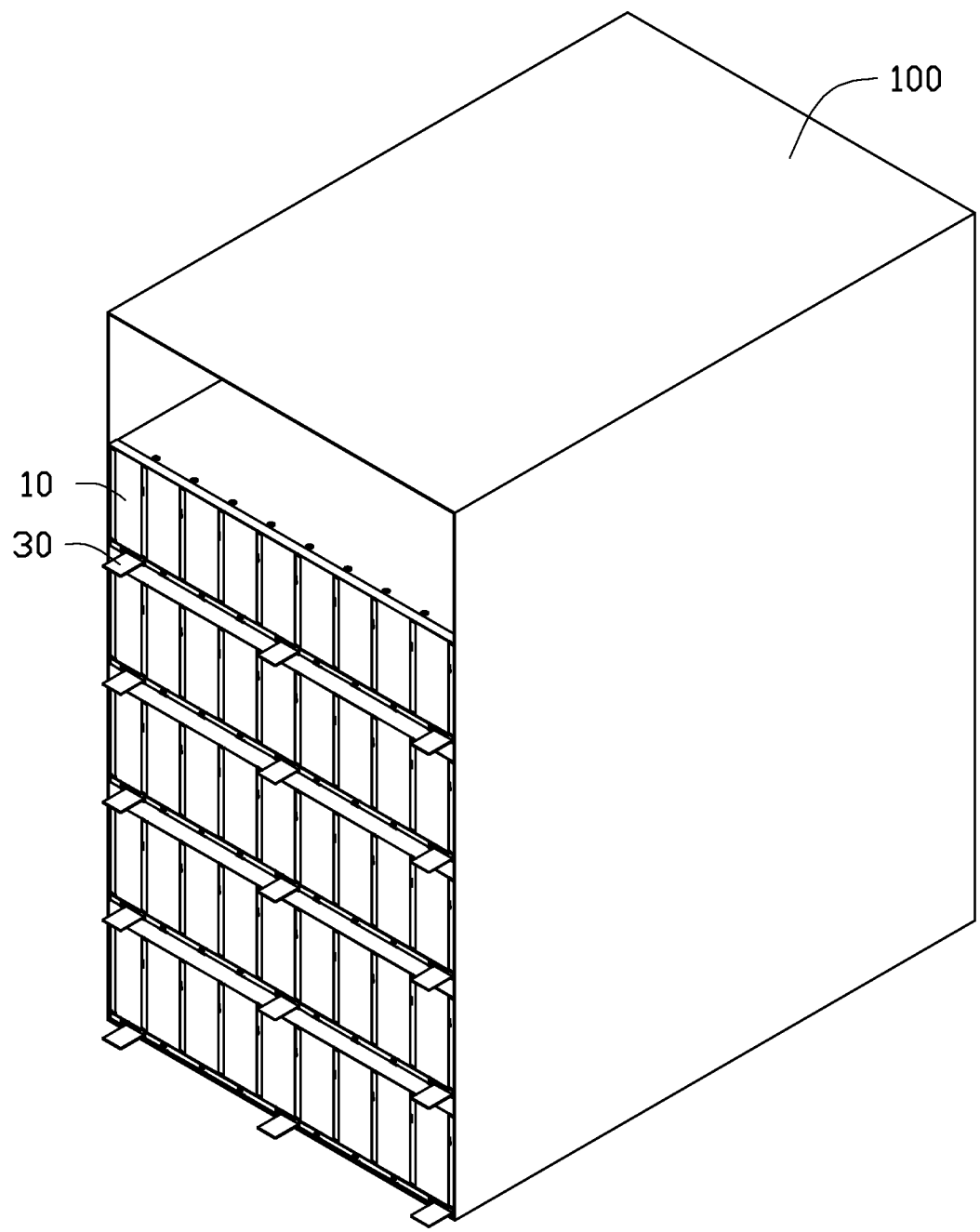
FIG. 5 is an assembled, isometric view of a cabinet installed with a plurality of servers in it.

FIG. 5 illustrates a cabinet 100 with a plurality of servers 1 installed therein, and the indicating tags 30 extend out of the main bodies 10 for easy identification.

It is to be understood, however, that even though numerous characteristics and advantages of the embodiments have been set forth in the foregoing description, together with details of the structure and function of the embodiments, the disclosure is illustrative only, and changes may be made in detail, especially in the matters of shape, size, and arrangement of parts within the principles of the present disclosure to the full extent indicated by the broad general meaning of the terms in which the appended claims are expressed.

What is claimed is:

1. A server comprising:
   a main body, comprising:
      a plurality of electronic elements;
      a plurality of engaging holes corresponding to the electronic elements; and
      a separating plate located between each two adjacent electronic elements, wherein a gap is defined between the separating plate and the main body; and
   a plurality of indicating tags, each of the plurality of indicating tags comprising a mounting plate;
      a through hole defining at one end of the mounting plate wherein the through hole corresponds to the engaging hole; and
      an engaging portion extending outwardly from the other end, which is opposite to the one end, of the mounting plate;
      wherein the engaging portion engages in the gap, and the indicating tags are fixed to the main body with fasteners extending through the through holes to engage in the engaging holes.

2. The server of claim 1, wherein the engaging holes are defined at a lower edge of the main body, and the gap is located between the separating plate and the lower edge of the main body.

3. The server of claim 1, wherein the tag plate further comprises a label plate perpendicularly coupled to the mounting plate.

\* \* \* \* \*